US009438825B2

(12) United States Patent
Mumaw

(10) Patent No.: US 9,438,825 B2
(45) Date of Patent: Sep. 6, 2016

(54) INFRARED SENSOR AMPLIFICATION TECHNIQUES FOR THERMAL IMAGING

(71) Applicant: Fluke Corporation, Everett, WA (US)

(72) Inventor: David T. Mumaw, Minneapolis, MN (US)

(73) Assignee: Fluke Corporation, Everett, WA (US)

(*) Notice: Subject to any disclaimer, the term of this patent is extended or adjusted under 35 U.S.C. 154(b) by 587 days.

(21) Appl. No.: 13/710,024

(22) Filed: Dec. 10, 2012

(65) Prior Publication Data
US 2014/0160299 A1    Jun. 12, 2014

(51) Int. Cl.
| | |
|---|---|
| *H04N 5/33* | (2006.01) |
| *H04N 3/02* | (2006.01) |
| *H01L 27/14* | (2006.01) |
| *H01L 31/00* | (2006.01) |
| *G01J 5/20* | (2006.01) |
| *G01J 5/08* | (2006.01) |
| *H03G 1/00* | (2006.01) |
| *H04N 3/09* | (2006.01) |
| *H04N 5/225* | (2006.01) |
| *H04N 5/378* | (2011.01) |
| *H04N 5/232* | (2006.01) |

(52) U.S. Cl.
CPC . *H04N 5/33* (2013.01); *G01J 5/08* (2013.01); *H03G 1/0023* (2013.01); *H04N 3/09* (2013.01); *H04N 5/2252* (2013.01); *H04N 5/23293* (2013.01); *H04N 5/378* (2013.01)

(58) Field of Classification Search
CPC .. H04N 5/2254; H04N 5/23216; H04N 5/33; H04N 5/378; H04N 5/57

USPC ........ 348/164, E3.01, E5.09, 166, 167, 201; 250/252.1, 330, 332, 338.1, 338.4, 250/339.04, 334; 330/254
See application file for complete search history.

(56) References Cited

U.S. PATENT DOCUMENTS

| | | | | |
|---|---|---|---|---|
| 3,381,529 | A * | 5/1968 | Martin et al. | 73/170.15 |
| 4,868,652 | A * | 9/1989 | Nutton | 348/167 |
| 5,449,910 | A * | 9/1995 | Wood et al. | 250/338.1 |
| 5,682,035 | A * | 10/1997 | Gallagher | H04N 5/3651 250/332 |
| 5,756,999 | A | 5/1998 | Parrish et al. | |
| 6,255,650 | B1 * | 7/2001 | Warner et al. | 250/330 |
| 6,444,983 | B1 | 9/2002 | McManus et al. | |
| 6,465,785 | B1 | 10/2002 | McManus | |
| 7,304,297 | B1 * | 12/2007 | King et al. | 250/252.1 |
| 7,417,230 | B2 | 8/2008 | Anderson et al. | |
| 7,661,876 | B2 | 2/2010 | Liebmann | |
| 7,683,321 | B1 | 3/2010 | King et al. | |
| 7,772,557 | B2 | 8/2010 | Anderson | |
| 7,880,777 | B2 | 2/2011 | Anderson | |

(Continued)

*Primary Examiner* — Geepy Pe
*Assistant Examiner* — Syed Y. Hasan
(74) *Attorney, Agent, or Firm* — Fredrikson & Byron, P.A.

(57) ABSTRACT

Thermal imaging devices, systems, and methods are provided with IR sensor amplification techniques that in some cases provide a gain transfer function having at least two different gain regions. One thermal imaging camera includes an IR camera module, processing circuitry, and an amplifier stage that comprises a continuous gain function including at least two gain regions having different gains. In some cases a thermal imager is provided with saturation circuitry configured to reduce the gain of the amplifier stage in order to provide one of at least two different gain regions within the continuous gain function. In some cases amplification techniques provide a continuous gain function that includes both linear and nonlinear gain regions. One or more gain regions may further be calibrated for measuring temperature.

26 Claims, 7 Drawing Sheets

(56) References Cited

U.S. PATENT DOCUMENTS 8,177,421 B2 5/2012 Liebmann
8,233,050 B2 7/2012 Schmidt et al.
2004/0253003 A1* 12/2004 Farmer et al. ................ 398/214
2010/0014746 A1* 1/2010 Warnke et al. ............... 382/141
2010/0128912 A1* 5/2010 Schiller ......................... 381/321
2013/0170520 A1* 7/2013 Englasyam et al. .......... 374/178

* cited by examiner

INFRARED SENSOR AMPLIFICATION TECHNIQUES FOR THERMAL IMAGING

FIELD

This disclosure relates generally to thermal imaging, and relates more particularly to systems, devices, and methods for conditioning an electrical signal output from an infrared sensor.

BACKGROUND

Thermal imaging cameras are used in a variety of situations. For example, thermal imaging cameras are often used during maintenance inspections to thermally inspect equipment. Example equipment may include rotating machinery, electrical panels, or rows of circuit breakers, among other types of equipment. Thermal inspections can detect equipment hot spots such as overheating machinery or electrical components, helping to ensure timely repair or replacement of the overheating equipment before a more significant problem develops.

Thermal imaging cameras generally include an infrared (IR) camera module that incorporates an array of infrared sensors or detectors for sensing IR radiation and generating corresponding electrical signals. One well-known type of infrared detector is the "bolometer," which operates on the principle that the electrical resistance of the bolometer material changes with respect to the bolometer temperature, which in turn changes in response to the quantity of absorbed incident IR radiation. These characteristics can be exploited to measure incident infrared radiation on the bolometer by sensing the resulting change in its resistance.

Microbolometer detector arrays may be used to sense a focal plane of incident IR radiation. Each microbolometer detector of an array may absorb any radiation incident thereon, resulting in a corresponding change in its temperature, which results in a corresponding change in its resistance. With each microbolometer functioning as a pixel, a two-dimensional image or picture representation of the incident IR radiation may be generated by translating the changes in resistance of each microbolometer into a time-multiplexed electrical signal that can be displayed on a monitor or stored in a computer. As used herein, the term "pixel" is equivalent to the terms "detector," "sensor," and more specifically in some cases, "microbolometer." The circuitry used to perform this translation is commonly known as a Read Out Integrated Circuit (ROIC), and is commonly fabricated as an integrated circuit on a silicon substrate. The microbolometer array may then be fabricated on top of the ROIC. The combination of the ROIC and microbolometer array is commonly known as a microbolometer infrared Focal Plane Array (FPA). Microbolometer focal plane arrays may contain different numbers of detectors. One common example is an FPA with as many as 640×480 detectors.

Methods for implementing an ROIC for microbolometer arrays have used an architecture wherein the resistance of each microbolometer is sensed by applying a uniform electric signal source, e.g., voltage or current sources, and a resistive load to the microbolometer element. The current resulting from the applied voltage is integrated over time by an amplification stage to produce an output voltage level proportional to the value of the integrated current. The output voltage can then converted to a digital signal using an analog-to-digital converter (ADC) and multiplexed with other conditioned bolometer readings to generate an image of the target scene.

One measure of a thermal imaging camera's performance is the camera's dynamic range, which refers to the range of temperatures in a target scene that can be imaged by the camera at any one time. As is known, thermal imaging cameras employing microbolometer FPAs suffer from a necessary compromise in performance between the camera's imaging dynamic range and system noise. In general, if a scene with very large temperature differences is expected to be imaged with the FPA, the overall gain can be set lower so that a wide range of detector responses (corresponding to the wide range of temperatures) can be processed without exceeding circuit maximum and/or minimum signal levels, such as in the amplification stage or the input of the A/D converter. Gains that are too low, though, can decrease the system's signal-to-noise ratio. In addition, low gains may unnecessarily "compress" the histogram of detector responses and thereby decrease the effective resolution of the ADC, as well as leave a portion of the input range thereof unused. On the contrary, while high gains may provide high signal-to-noise performance, gains that are too high can "widen" or "spread" the histogram of detector responses so that output signal values for some microbolometer pixels are out of the input range of the A/D (i.e., greater than Vmax or less than Vmin), thus decreasing the dynamic range.

One method currently used to address this tradeoff is to configure a thermal imaging camera with two or more ranges with corresponding gain settings. The camera can then switch between the two or more ranges/settings depending upon the instantaneous distribution of temperatures in a target scene in an attempt to obtain a best fit between one of the camera ranges and the particular range of temperatures currently being imaged. While this approach has been useful, it often requires frequent shutter firing as the camera circuitry switches between gain settings, which can cause noticeable and undesirable pauses in a thermal imaging display as viewed by a user. In the event that the imager also measures temperature, such an approach also requires calibration of multiple ranges, which can extend the calibration time and build time of a camera in rough proportion to the number of ranges included.

SUMMARY

Some embodiments of the invention generally relate to amplifying the output of an infrared sensor with an amplifier stage that can provide, among other things, improved noise and/or dynamic range performance. According to one aspect, thermal imaging cameras are provided. In one embodiment, a thermal imaging camera is provided with at least an infrared (IR) camera module, an amplifier stage, and processing circuitry. The IR camera module has an IR sensor for detecting IR radiation from a target scene, which itself includes multiple IR sensor elements arranged to receive the IR radiation from the target scene. Each IR sensor element corresponds to part of a thermal image of the target scene and has an electrical characteristic that varies corresponding to an amount of the IR radiation received by the IR sensor element. The amplifier stage is coupled to the IR sensor and receives a sensor output signal based on the electrical characteristic of at least one of the IR sensor elements. The amplifier stage also has a gain provided according to a continuous gain function. The continuous gain function is configured to amplify the sensor output signal through a continuous range of sensor output values to generate an amplifier output signal with a corresponding continuous range of amplifier output values. The continuous gain function also includes a first gain region having a first gain and a second gain region having a second gain different than the first gain. The processing circuitry is coupled to the amplifier stage and configured to generate the thermal image of the target scene based on the amplifier output signal.

According to another aspect, thermal imaging apparatuses and other devices are provided. In one embodiment, a thermal imaging apparatus has, among other things, an IR camera module and an amplifier stage. The IR camera module includes an IR sensor for detecting IR radiation from a target scene. The IR sensor includes a plurality of IR sensor elements arranged to receive the IR radiation from the target scene. Each IR sensor element also has an electrical characteristic that varies corresponding to an amount of the IR radiation received by the IR sensor element. The amplifier stage is coupled to the IR sensor and receives a sensor output signal based on the electrical characteristic of one of the IR sensor elements. The amplifier stage also includes a gain for amplifying the sensor output signal to generate an amplifier output signal. The gain is provided according to a continuous gain function configured to amplify the sensor output signal through a continuous range of sensor output values to generate the amplifier output signal with a corresponding continuous range of amplifier output values. The amplifier stage also includes saturation circuitry configured to reduce the gain of the amplifier stage according to the continuous gain function based on the amplifier output signal meeting a threshold value below a maximum amplifier output.

According to another aspect, methods related to IR sensor amplification are provided. In one embodiment a method includes receiving a sensor output signal from an IR sensor of a thermal imaging camera, amplifying the sensor output signal with a gain of an amplifier stage to generate an amplifier output signal, and generating a thermal image of the target scene based on the amplifier output signal. The gain if the amplifier stage is provided according to a continuous gain function configured to amplify the sensor output signal through a continuous range of sensor output values to generate the amplifier output signal with a corresponding continuous range of amplifier output values. Amplifying the sensor output signal also includes if the sensor output signal is within a first range of sensor output signals, amplifying according to a first gain region of the continuous gain function. Amplifying the sensor output signal also includes if the sensor output signal is within a second range of sensor output signals, amplifying according to a second gain region of the continuous gain function. The second range of sensor output signals is based on the amplifier output signal meeting a threshold value below a maximum amplifier output.

These and various other embodiments, features and advantages will be apparent from a reading of the following detailed description.

BRIEF DESCRIPTION OF DRAWINGS

The following drawings illustrate some particular embodiments of the present invention and therefore do not limit the scope of the invention. The drawings are not to scale (unless so stated) and are intended for use in conjunction with the explanations in the following detailed description. Some embodiments will hereinafter be described in conjunction with the appended drawings, wherein like numerals denote like elements.

DETAILED DESCRIPTION

The following detailed description is exemplary in nature and is not intended to limit the scope, applicability, or configuration of the invention in any way. Rather, the following description provides some practical illustrations for implementing examples of the present invention. Examples of constructions, materials, dimensions, and manufacturing processes are provided for selected elements, and all other elements employ that which is known to those of ordinary skill in the field of the invention. Those skilled in the art will recognize that many of the noted examples have a variety of suitable alternatives.

Embodiments and examples that are described hereinafter, particularly with reference to FIGS. 4-7, generally relate to amplifying the output of an infrared sensor or detector (sensor and detector are used interchangeably herein) with an amplifier stage that can provide, among other things, improved noise and/or dynamic range performance. Some particular examples are illustrated with respect to an infrared imaging camera, an example of which will be described with reference to FIGS. 1-3. It should be appreciated, though, that embodiments and techniques disclosed herein may be useful for amplifying the output of one or more IR sensors included in many types of thermal imaging apparatuses, systems, and methods. For example, aspects of the teachings described herein can be implemented in a handheld thermal imaging camera including a display. As another example, some embodiments may provide a thermal imaging apparatus without an onboard display, such as a camera that views and records a target scene in the IR spectrum and then transmits the recorded images to another location. Of course those skilled in the art will appreciate that examples beyond the embodiments discussed herein are also possible in light of this disclosure.

Figure 1:
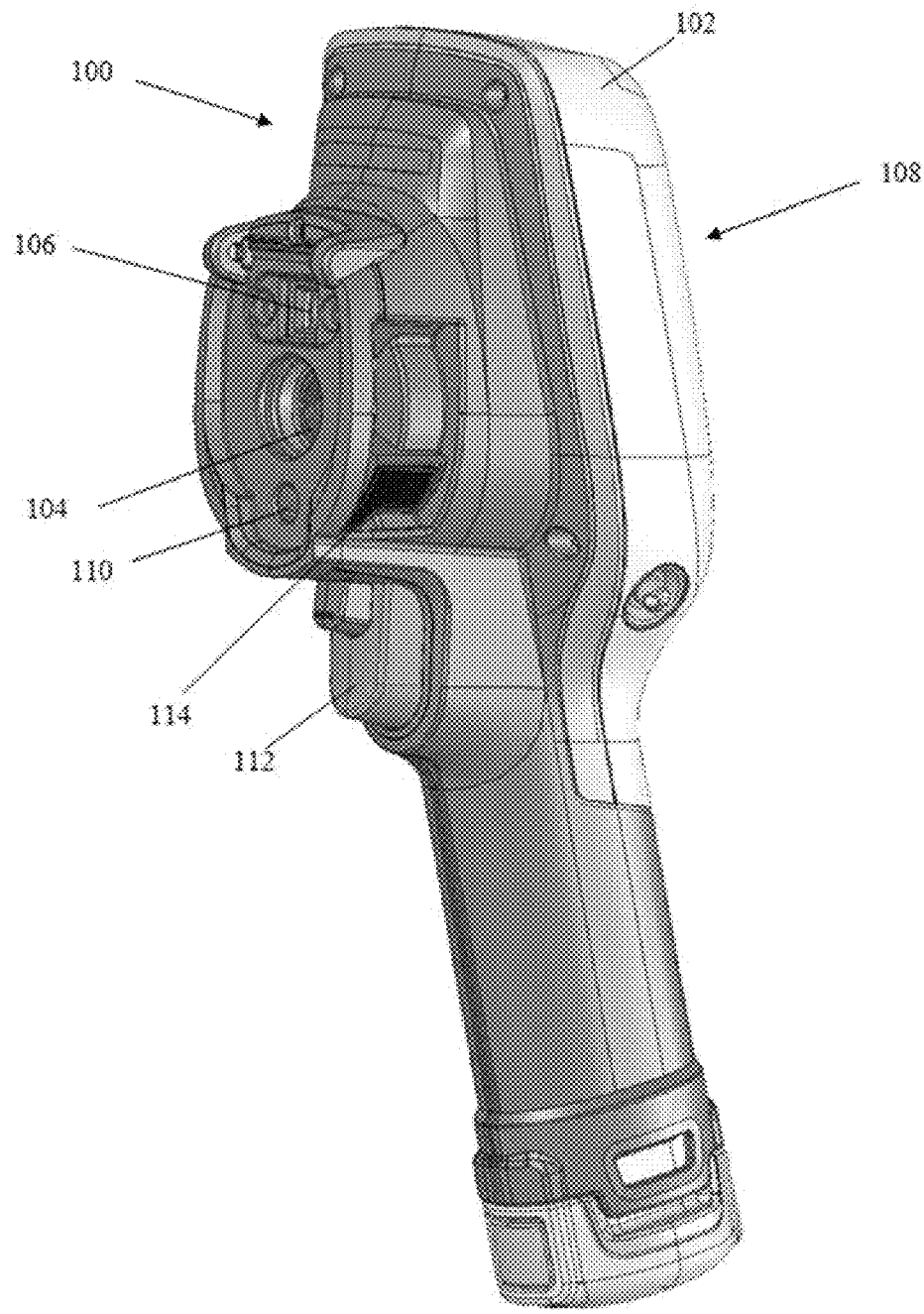
FIG. 1 is a perspective front view of a thermal imaging camera according to an embodiment.
Figure 2:
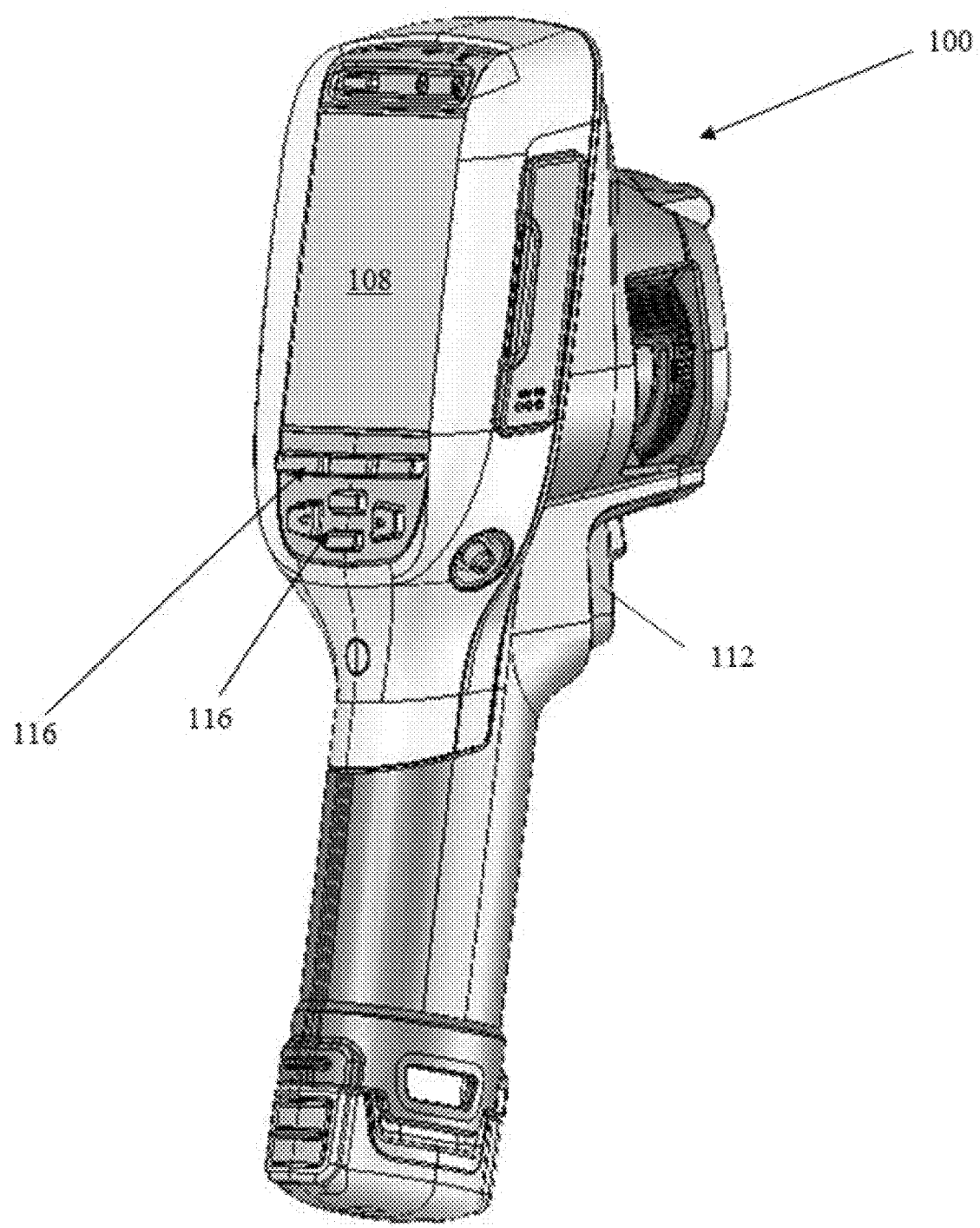
FIG. 2 is a perspective back view of the thermal imaging camera of FIG. 1 according to an embodiment.

An example of a thermal imaging camera 100 will now be described in detail with respect to FIGS. 1-3. FIGS. 1 and 2 show front and back perspective views, respectively, of the example thermal imaging camera 100 according to an embodiment. The camera 100 includes a housing 102, an infrared lens assembly 104, a visible light lens assembly 106, a display 108, a laser 110, and a trigger control 112. Housing 102 houses the various components of thermal imaging camera 100. The bottom portion of thermal imaging camera 100 includes a carrying handle for holding and operating the camera via one hand. Infrared lens assembly 104 receives infrared radiation from a scene and focuses the radiation on an infrared sensor for generating an infrared image of a scene. Visible light lens assembly 106 receives visible light from a scene and focuses the visible light on a visible light sensor for generating a visible light image of the same scene. Thermal imaging camera 100 captures the visible light image and/or the infrared image in response to depressing trigger control 112. In addition, thermal imaging camera 100 controls display 108 to display the infrared image and the visible light image generated by the camera, e.g., to help an operator thermally inspect a scene. Thermal imaging camera 100 may also include a focus mechanism coupled to infrared lens assembly 104 that is configured to move at least one lens of the infrared lens assembly so as to adjust the focus of an infrared image generated by the thermal imaging camera.

In operation, thermal imaging camera 100 detects heat patterns in a scene by receiving energy emitted in the infrared-wavelength spectrum from the scene and processing the IR energy to generate a thermal image. Thermal imaging camera 100 may also generate a visible light image of the same scene by receiving energy in the visible light-wavelength spectrum and processing the visible light energy to generate a visible light image. As described in greater detail below, thermal imaging camera 100 may include an infrared camera module that is configured to capture an infrared image of the scene and a visible light camera module that is configured to capture a visible light image of the same scene. The infrared camera module may receive infrared radiation projected through infrared lens assembly 104 and generate therefrom infrared image data. The visible light camera module may receive light projected through visible light lens assembly 106 and generate therefrom visible light data.

In some examples, thermal imaging camera 100 collects or captures the infrared energy and visible light energy substantially simultaneously (e.g., at the same time) so that the visible light image and the infrared image generated by the camera are of the same scene at substantially the same time. In these examples, the infrared image generated by thermal imaging camera 100 is indicative of localized temperatures within the scene at a particular period of time while the visible light image generated by the camera is indicative of the same scene at the same period of time. In other examples, thermal imaging camera may capture infrared energy and visible light energy from a scene at different periods of time. Of course, in some cases a thermal imaging camera may not include a visible light camera module.

Visible light lens assembly 106 includes at least one lens that focuses visible light energy on a visible light sensor for generating a visible light image. Visible light lens assembly 106 defines a visible light optical axis which passes through the center of curvature of the at least one lens of the assembly. Visible light energy projects through a front of the lens and focuses on an opposite side of the lens. Visible light lens assembly 106 can include a single lens or a plurality of lenses (e.g., two, three, or more lenses) arranged in series. In addition, visible light lens assembly 106 can have a fixed focus or can include a focus adjustment mechanism for changing the focus of the visible light optics. In examples in which visible light lens assembly 106 includes a focus adjustment mechanism, the focus adjustment mechanism may be a manual adjustment mechanism or an automatic adjustment mechanism.

Infrared lens assembly 104 also includes at least one lens that focuses infrared energy on an infrared sensor for generating a thermal image. Infrared lens assembly 104 defines an infrared optical axis which passes through the center of curvature of lens of the assembly. During operation, infrared energy is directed through the front of the lens and focused on an opposite side of the lens. Infrared lens assembly 104 can include a single lens or a plurality of lenses (e.g., two, three, or more lenses), which may be arranged in series.

As briefly described above, thermal imaging camera 100 includes a focus mechanism for adjusting the focus of an infrared image captured by the camera. In the example shown in FIGS. 1 and 2, thermal imaging camera 100 includes focus ring 114. Focus ring 114 is operatively coupled (e.g., mechanically and/or electrically coupled) to at least one lens of infrared lens assembly 104 and configured to move the at least one lens to various focus positions so as to focus the infrared image captured by thermal imaging camera 100. Focus ring 114 may be manually rotated about at least a portion of housing 102 so as to move the at least one lens to which the focus ring is operatively coupled. In some examples, focus ring 114 is also operatively coupled to display 108 such that rotation of focus ring 114 causes at least a portion of a visible light image and at least a portion of an infrared image concurrently displayed on display 108 to move relative to one another. In different examples, thermal imaging camera 100 may include a manual focus adjustment mechanism that is implemented in a configuration other than focus ring 114.

In some examples, thermal imaging camera 100 may include an automatically adjusting focus mechanism in addition to or in lieu of a manually adjusting focus mechanism. An automatically adjusting focus mechanism may be operatively coupled to at least one lens of infrared lens assembly 104 and configured to automatically move the at least one lens to various focus positions, e.g., in response to instructions from thermal imaging camera 100. In one application of such an example, thermal imaging camera 100 may use laser 110 to electronically measure a distance between an object in a target scene and the camera, referred to as the distance-to-target. Thermal imaging camera 100 may then control the automatically adjusting focus mechanism to move the at least one lens of infrared lens assembly 104 to a focus position that corresponds to the distance-to-target data determined by thermal imaging camera 100. The focus position may correspond to the distance-to-target data in that the focus position may be configured to place the object in the target scene at the determined distance in focus. In some examples, the focus position set by the automatically adjusting focus mechanism may be manually overridden by an operator, e.g., by rotating focus ring 114.

Data of the distance-to-target, as measured by the laser 110, can be stored and associated with the corresponding captured image. For images which are captured using automatic focus, this data will be gathered as part of the focusing process. In some embodiments, the thermal imaging camera will also detect and save the distance-to-target data when an image is captured. This data may be obtained by the thermal imaging camera when the image is captured by using the laser 110 or, alternatively, by detecting the lens position and correlating the lens position to a known distance-to-target associated with that lens position. The distance-to-target data may be used by the thermal imaging camera 100 to direct the user to position the camera at the same distance from the target, such as by directing a user to move closer or further from the target based on laser measurements taken as the user repositions the camera, until the same distance-to-target is achieved as in an earlier image. The thermal imaging camera may further automatically set the lenses to the same positions as used in the earlier image, or may direct the user to reposition the lenses until the original lens settings are obtained.

During operation of thermal imaging camera 100, an operator may wish to view a thermal image of a scene and/or a visible light image of the same scene generated by the camera. For this reason, thermal imaging camera 100 may include a display. In the examples of FIGS. 1 and 2, thermal imaging camera 100 includes display 108, which is located on the back of housing 102 opposite infrared lens assembly 104 and visible light lens assembly 106. Display 108 may be configured to display a visible light image, an infrared image, and/or a fused image that is a simultaneous display of the visible light image and the infrared image. In different examples, display 108 may be remote (e.g., separate) from infrared lens assembly 104 and visible light lens assembly 106 of thermal imaging camera 100, or display 108 may be in a different spatial arrangement relative to infrared lens assembly 104 and/or visible light lens assembly 106. Therefore, although display 108 is shown behind infrared lens assembly 104 and visible light lens assembly 106 in FIG. 2, other locations for display 108 are possible.

Thermal imaging camera 100 can include a variety of user input media for controlling the operation of the camera and adjusting different settings of the camera. Example control functions may include adjusting the focus of the infrared and/or visible light optics, opening/closing a shutter, capturing an infrared and/or visible light image, or the like. In the example of FIGS. 1 and 2, thermal imaging camera 100 includes a depressible trigger control 112 for capturing an infrared and visible light image, and buttons 116, which form part of the user interface, for controlling other aspects of the operation of the camera. A different number or arrangement of user input media are possible, and it should be appreciated that the disclosure is not limited in this respect. For example, thermal imaging camera 100 may include a touch screen display 108 which receives user input by depressing different portions of the screen.

Figure 3:
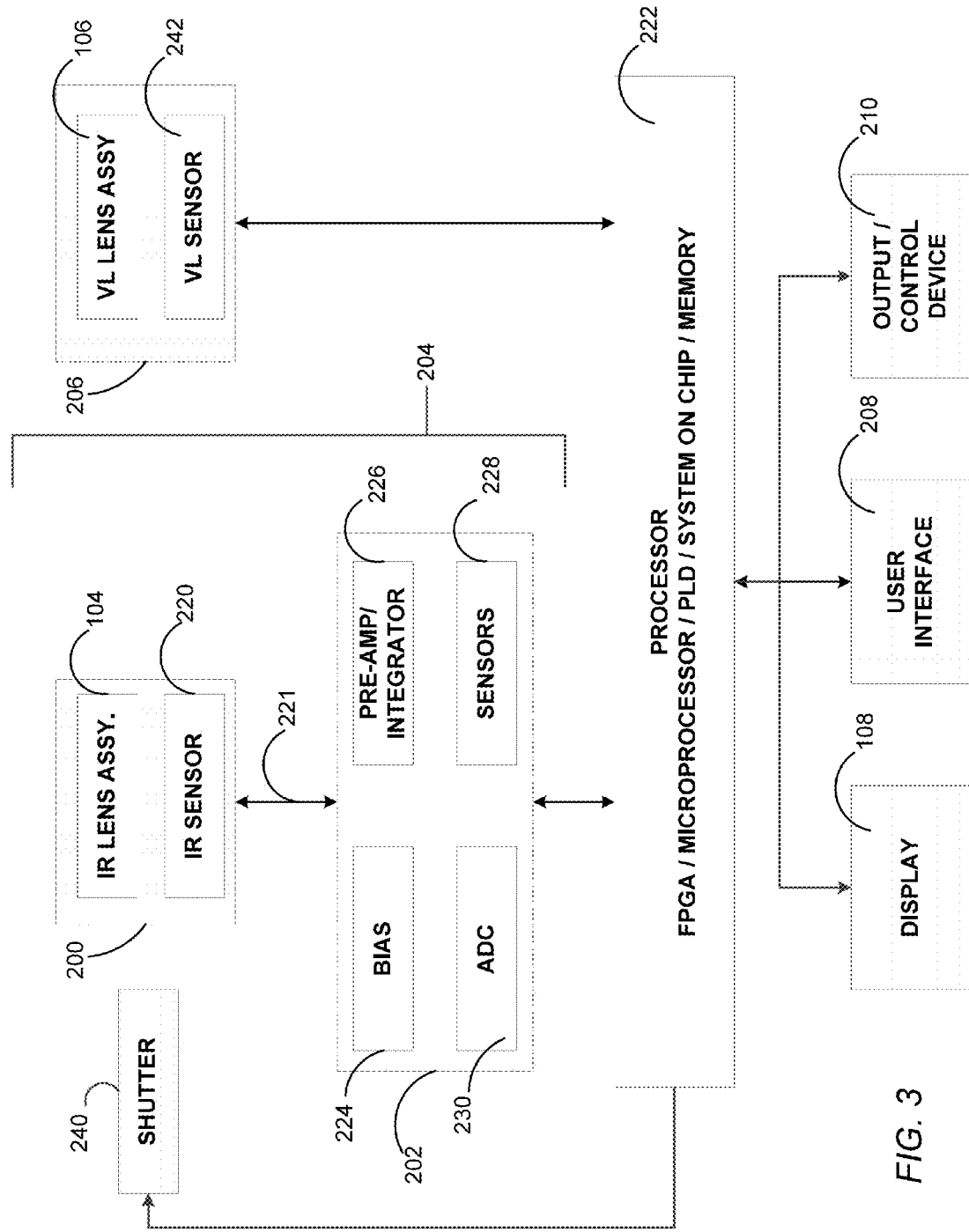
FIG. 3 is a functional block diagram illustrating components of the thermal imaging camera of FIGS. 1 and 2 according to an embodiment.

FIG. 3 is a functional block diagram illustrating an example of components for the thermal imaging camera 100. In this example, thermal imaging camera 100 includes an IR camera module 200 and front end circuitry 202. The IR camera module 200 and front end circuitry 202 are sometimes referred to in combination as front end stage or front end components 204 of the infrared camera 100. Thermal imaging camera 100 may also include a visible light camera module 206, a display 108, a user interface 208, and an output/control device 210.

Infrared camera module 200 may be configured to receive infrared energy emitted by a target scene and to focus the infrared energy on an infrared sensor for generation of infrared energy data, e.g., that can be displayed in the form of an infrared image on display 108 and/or stored in memory. Infrared camera module 200 can include any suitable components for performing the functions attributed to the module herein. In the example of FIG. 3, infrared camera module 200 is illustrated as including infrared lens assembly 104 and infrared sensor 220. As described above with respect to FIGS. 1 and 2, infrared lens assembly 104 includes at least one lens that takes infrared energy emitted by a target scene and focuses the infrared energy on infrared sensor 220. Infrared sensor 220 responds to the focused infrared energy by generating an electrical output signal 221 that can be converted and displayed as an infrared image on display 108.

Infrared lens assembly 104 can have a variety of different configurations. In some examples, infrared lens assembly 104 defines a F-number (which may also be referred to as a focal ratio or F-stop) of a specific magnitude. A F-number may be determined by dividing the focal length of a lens (e.g., an outermost lens of infrared lens assembly 104) by a diameter of an entrance to the lens, which may be indicative of the amount of infrared radiation entering the lens. In general, increasing the F-number of infrared lens assembly 104 may increase the depth-of-field, or distance between nearest and farthest objects in a target scene that are in acceptable focus, of the lens assembly. An increased depth of field may help achieve acceptable focus when viewing different objects in a target scene with the infrared optics of thermal imaging camera 100 set at a hyperfocal position. If the F-number of infrared lens assembly 104 is increased too much, however, the spatial resolution (e.g., clarity) may decrease such that a target scene is not in acceptable focus.

Infrared sensor 220 may include one or more focal plane arrays (FPA) that generate electrical signals in response to infrared energy received through infrared lens assembly 104. Each FPA can include a plurality of infrared sensor elements including, e.g., bolometers, photon detectors, or other suitable infrared sensor elements. In operation, each sensor element, which may each be referred to as a sensor pixel, may change an electrical characteristic (e.g., voltage or resistance) in response to absorbing infrared energy received from a target scene. In turn, the change in electrical characteristic corresponding to the IR radiation received by the sensor element can provide the electrical signal 221, also referred to herein as the IR output signal, that can be eventually received by a processor 222 and processed into an infrared image displayed on display 108.

For instance, in examples in which infrared sensor 220 includes a plurality of bolometers, each bolometer may absorb infrared energy focused through infrared lens assembly 104 and increase in temperature in response to the absorbed energy. The electrical resistance of each bolometer may change as the temperature of the bolometer changes. With each detector element functioning as a pixel, a two-dimensional image or picture representation of the infrared radiation can be further generated by translating the changes in resistance of each detector element into a time-multiplexed electrical signal that can be processed for visualization on a display or storage in memory (e.g., of a computer). Processor 222 may measure the change in resistance of each bolometer by applying a current (or voltage) to each bolometer and measure the resulting voltage (or current) across the bolometer. Based on these data, processor 222 can determine the amount of infrared energy emitted by different portions of a target scene and control display 108 to display a thermal image of the target scene.

Independent of the specific type of infrared sensor elements included in the FPA of infrared sensor 220, the FPA array can define any suitable size and shape. In some examples, infrared sensor 220 includes a plurality of infrared sensor elements arranged in a grid pattern such as, e.g., an array of sensor elements arranged in vertical columns and horizontal rows. In various examples, infrared sensor 220 may include an array of vertical columns by horizontal rows of, e.g., 16×16, 50×50, 160×120, 120×160, or 640×480. In other examples, infrared sensor 220 may include a smaller number of vertical columns and horizontal rows (e.g., 1×1), a larger number vertical columns and horizontal rows (e.g., 1000×1000), or a different ratio of columns to rows.

In certain embodiments a Read Out Integrated Circuit (ROIC) is incorporated on the IR sensor 220. The ROIC is used to output signals corresponding to each of the pixels. Such ROIC is commonly fabricated as an integrated circuit on a silicon substrate. The plurality of sensor elements may be fabricated on top of the ROIC, wherein their combination provides for the IR sensor 220. In some embodiments, the ROIC can include components discussed elsewhere in this disclosure incorporated directly onto the FPA circuitry. Such integration of the ROIC, or other further levels of integration not explicitly discussed, should be considered within the scope of this disclosure.

As described above, the IR sensor 220 generates a series of electrical output signals 221 corresponding to the infrared radiation received by each IR sensor/detector element to represent a thermal image. A "frame" of thermal image data is generated when the voltage signal from each infrared detector element is obtained by scanning all of the rows that make up the IR sensor 220. Again, in certain embodiments involving bolometers as the infrared detector elements, such scanning is done by switching a corresponding detector element into the system circuit and applying a bias voltage across such switched-in element. Successive frames of thermal image data are generated by repeatedly scanning the rows of the IR sensor 220, with such frames being produced at a rate sufficient to generate a video representation (e.g. 30 Hz, or 60 Hz) of the thermal image data.

The front end circuitry 202 includes circuitry for interfacing with and controlling the IR camera module 200. In addition, the front end circuitry 202 initially processes and transmits collected infrared image data to a processor 222 via a connection therebetween. More specifically, the IR output signals 221 generated by the IR sensor 220 are initially conditioned by the front end circuitry 202 of the thermal imaging camera 100. As will be appreciated, FIG. 3 provides a high-level overview of some of the possible components that may be included in a thermal imaging camera's front end circuitry. Those skilled in the art will understand that the functions of the front end circuitry 202 can be implemented in a number of different ways, the details of which are not necessarily included herein for the sake of brevity. Several examples of known front end circuits for conditioning IR sensor output signals are described in greater detail in one or more of a family of related U.S. Patents that includes U.S. Pat. No. 6,444,983, to McManus, et al., filed Oct. 7, 1999, and U.S. Pat. No. 7,417,230, to Anderson, et al., filed Sep. 11, 2006, the content both of which is hereby incorporated by reference herein.

Returning to FIG. 3, in certain embodiments the front end circuitry 202 includes a bias generator 224. In addition to providing the detector bias, the bias generator 224 can optionally add or subtract an average bias current from the total current generated for each switched-in detector element. The average bias current can be changed in order (i) to compensate for deviations to the entire array of resistances of the detector elements resulting from changes in ambient temperatures inside the thermal imaging camera 100 and (ii) to compensate for array-to-array variations in the average detector elements of the IR sensor 220. Such bias compensation can be automatically controlled by the thermal imaging camera 100 or software, or can be user controlled via input to the output/control device 210 or processor 222.

Following provision of the detector bias and optional subtraction or addition of the average bias current, the signals can be passed through an amplifier/integrator stage 226, which may also be referred to as a pre-amplifier/integrator. Typically, the pre-amp/integrator 226 is used to condition incoming signals, e.g., prior to their digitization. As a result, the incoming signals can be adjusted to a form that enables more effective interpretation of the signals, and in turn, can lead to more effective resolution of the created image. As will be discussed in greater detail below, some embodiments provide an amplifier stage and/or an amplifying technique resulting in improved signal-to-noise performance and/or a relatively larger dynamic range. Subsequent to amplification/integration, the conditioned signals are sent downstream into the processor 222 of the thermal imaging camera 100.

In some embodiments, the front end circuitry 202 can include one or more additional elements for example, additional sensors 228 or an ADC 230. Additional sensors 228 can include, for example, temperature sensors, visual light sensors (such as a CCD), pressure sensors, magnetic sensors, etc. Such sensors can provide additional calibration and detection information to enhance the functionality of the thermal imaging camera 100. For example, temperature sensors can provide an ambient temperature reading near the IR sensor 220 to assist in radiometry calculations. A magnetic sensor, such as a Hall effect sensor, can be used in combination with a magnet mounted on the lens to provide lens focus position information. Such information can be useful for calculating distances, or determining a parallax offset for use with visual light scene data gathered from a visual light sensor.

The inclusion of an ADC 230 in the front end circuitry 202 may provide certain benefits, for example, digitization of scene and other sensor information prior to transmittal to the processor 222 via the connection therebetween. In some embodiments, the ADC 230 can be integrated into the ROIC, thereby eliminating the need for a separately mounted and installed ADC 230.

In some embodiments, front end components can further include a shutter 240. A shutter 240 can be externally or internally located relative to the lens assembly 104 and operate to open or close the view provided by the IR lens assembly 104. As is known in the art, the shutter 240 can be mechanically positionable, or can be actuated by an electromechanical device such as a DC motor or solenoid. Embodiments may include a calibration or setup software implemented method or setting which utilize the shutter 240 to establish appropriate bias levels for each detector element.

Components described as processors and processing circuitry within thermal imaging camera 100, including processor 222, may be implemented as one or more processors, such as one or more microprocessors, digital signal processors (DSPs), application specific integrated circuits (ASICs), field programmable gate arrays (FPGAs), programmable logic circuitry, or the like, either alone or in any suitable combination. Processor 222 may also include memory that stores program instructions and related data that, when executed by processor 222, cause thermal imaging camera 100 and processor 222 to perform the functions attributed to them in this disclosure. Memory may include any suitable type of non-transitory (e.g., physically embodied) computer-readable medium adapted to store digital data. Some types of memory include, but are not limited to, fixed or removable magnetic, optical, or electrical media, such as RAM, ROM, CD-ROM, DVD, hard or floppy magnetic disks, EEPROM, or the like. Memory may also include a removable memory portion that may be used to provide memory updates or increases in memory capacities. A removable memory may also allow image data to be easily transferred to another computing device, or to be removed before thermal imaging camera 100 is used in another application. Processor 222 may also be implemented as a System on Chip that integrates all components of a computer or other electronic system into a single chip. These elements manipulate the conditioned scene image data delivered from the front end stages 204 in order to provide output scene data that can be displayed or stored for use by the user. Subsequently, the processor 222 (processing circuitry) sends the processed data to a display 108 or other output/control device 210.

During operation of thermal imaging camera 100, processor 222 can control infrared camera module 200 to generate infrared image data for creating an infrared image. Processor 222 can generate a digital "frame" of infrared image data. By generating a frame of infrared image data, processor 222 captures an infrared image of a target scene at a given point in time.

Processor 222 can capture a single infrared image or "snap shot" of a target scene by measuring the electrical signal of each infrared sensor element included in the FPA of infrared sensor 220 a single time. Alternatively, processor 222 can capture a plurality of infrared images of a target scene by repeatedly measuring the electrical signal of each infrared sensor element included in the FPA of infrared sensor 220. In examples in which processor 222 repeatedly measures the electrical signal of each infrared sensor element included in the FPA of infrared sensor 220, processor 222 may generate a dynamic thermal image (e.g., a video representation) of a target scene. For example, processor 222 may measure the electrical signal of each infrared sensor element included in the FPA at a rate sufficient to generate a video representation of thermal image data such as, e.g., 30 Hz or 60 Hz. Processor 222 may perform other operations in capturing an infrared image such as sequentially actuating a shutter 240 to open and close an aperture of infrared lens assembly 104, or the like.

With each sensor element of infrared sensor 220 functioning as a sensor pixel, processor 222 can generate a two-dimensional image or picture representation of the infrared radiation from a target scene by translating changes in an electrical characteristic (e.g., resistance) of each sensor element into a time-multiplexed electrical signal that can be processed, e.g., for visualization on display 108 and/or storage in memory. Processor 222 may perform computations to convert raw infrared image data into scene temperatures (radiometry) including, in some examples, colors corresponding to the scene temperatures.

Processor 222 may control display 108 to display at least a portion of an infrared image of a captured target scene. In some examples, processor 222 controls display 108 so that the electrical response of each sensor element of infrared sensor 220 is associated with a single pixel on display 108. In other examples, processor 222 may increase or decrease the resolution of an infrared image so that there are more or fewer pixels displayed on display 108 than there are sensor elements in infrared sensor 220. Processor 222 may control display 108 to display an entire infrared image (e.g., all portions of a target scene captured by thermal imaging camera 100) or less than an entire infrared image (e.g., a lesser port of the entire target scene captured by thermal imaging camera 100). Processor 222 may perform other image processing functions, as described in greater detail below.

Independent of the specific circuitry, thermal imaging camera 100 may be configured to manipulate data representative of a target scene so as to provide an output that can be displayed, stored, transmitted, or otherwise utilized by a user.

Thermal imaging camera 100 includes visible light camera module 206. Visible light camera module 206 may be configured to receive visible light energy from a target scene and to focus the visible light energy on a visible light sensor for generation of visible light energy data, e.g., that can be displayed in the form of a visible light image on display 108 and/or stored in memory. Visible light camera module 206 can include any suitable components for performing the functions attributed to the module herein. In the example of FIG. 3, visible light camera module 206 is illustrated as including visible light lens assembly 106 and visible light sensor 242. As described above with respect to FIGS. 1 and 2, visible light lens assembly 106 includes at least one lens that takes visible light energy emitted by a target scene and focuses the visible light energy on visible light sensor 242. Visible light sensor 242 responds to the focused energy by generating an electrical signal that can be converted and displayed as a visible light image on display 108.

Visible light sensor 242 may include a plurality of visible light sensor elements such as, e.g., CMOS detectors, CCD detectors, PIN diodes, avalanche photo diodes, or the like. The number of visible light sensor elements may be the same as or different than the number of infrared light sensor elements.

In operation, optical energy received from a target scene may pass through visible light lens assembly 106 and be focused on visible light sensor 242. When the optical energy impinges upon the visible light sensor elements of visible light sensor 242, photons within the photodetectors may be released and converted into a detection current. Processor 222 can process this detection current to form a visible light image of the target scene.

During use of thermal imaging camera 100, processor 222 can control visible light camera module 206 to generate visible light data from a captured target scene for creating a visible light image. The visible light data may include luminosity data indicative of the color(s) associated with different portions of the captured target scene and/or the magnitude of light associated with different portions of the captured target scene. Processor 222 can generate a "frame" of visible light image data by measuring the response of each visible light sensor element of thermal imaging camera 100 a single time. By generating a frame of visible light data, processor 222 captures visible light image of a target scene at a given point in time. Processor 222 may also repeatedly measure the response of each visible light sensor element of thermal imaging camera 100 so as to generate a dynamic thermal image (e.g., a video representation) of a target scene, as described above with respect to infrared camera module 200.

With each sensor element of visible light camera module 206 functioning as a sensor pixel, processor 222 can generate a two-dimensional image or picture representation of the visible light from a target scene by translating an electrical response of each sensor element into a time-multiplexed electrical signal that can be processed, e.g., for visualization on display 108 and/or storage in memory.

Processor 222 may control display 108 to display at least a portion of a visible light image of a captured target scene. In some examples, processor 222 controls display 108 so that the electrical response of each sensor element of visible light camera module 206 is associated with a single pixel on display 108. In other examples, processor 222 may increase or decrease the resolution of a visible light image so that there are more or fewer pixels displayed on display 108 than there are sensor elements in visible light camera module 206. Processor 222 may control display 108 to display an entire visible light image (e.g., all portions of a target scene captured by thermal imaging camera 100) or less than an entire visible light image (e.g., a lesser port of the entire target scene captured by thermal imaging camera 100).

As noted above, processor 222 may be configured to determine a distance between thermal imaging camera 100 and an object in a target scene captured by a visible light image and/or infrared image generated by the camera. Processor 222 may determine the distance based on a focus position of the infrared optics associated with the camera. For example, processor 222 may detect a position (e.g., a physical position) of a focus mechanism associated with the infrared optics of the camera (e.g., a focus position associated with the infrared optics) and determine a distance-to-target value associated with the position. Processor 222 may then reference data stored in memory that associates different positions with different distance-to-target values to determine a specific distance between thermal imaging camera 100 and the object in the target scene.

In these and other examples, processor 222 may control display 108 to concurrently display at least a portion of the visible light image captured by thermal imaging camera 100 and at least a portion of the infrared image captured by thermal imaging camera 100. Such a concurrent display may be useful in that an operator may reference the features displayed in the visible light image to help understand the features concurrently displayed in the infrared image, as the operator may more easily recognize and distinguish different real-world features in the visible light image than the infrared image. In various examples, processor 222 may control display 108 to display the visible light image and the infrared image in side-by-side arrangement, in a picture-in-picture arrangement, where one of the images surrounds the other of the images, or any other suitable arrangement where the visible light and the infrared image are concurrently displayed.

For example, processor 222 may control display 108 to display the visible light image and the infrared image in a fused arrangement. In a fused arrangement, the visible light image and the infrared image may be superimposed on top of one another. An operator may interact with user interface 208 to control the transparency or opaqueness of one or both of the images displayed on display 108. For example, the operator may interact with user interface 208 to adjust the infrared image between being completely transparent and completely opaque and also adjust the visible light image between being completely transparent and completely opaque. Such an example fused arrangement, which may be referred to as an alpha-blended arrangement, may allow an operator to adjust display 108 to display an infrared-only image, a visible light-only image, of any overlapping combination of the two images between the extremes of an infrared-only image and a visible light-only image. Processor 222 may also fuse scene information with other data, such as radiometric data, alarm data, and the like.

Additionally, in some embodiments, the processor 222 can interpret and execute commands from user interface 208, an output/control device 210. This can involve processing of various input signals and transferring those signals to the front end circuitry 202 via a connection therebetween. Components (e.g. motors, or solenoids) proximate the front end circuitry 202 can be actuated to accomplish the desired control function. Exemplary control functions can include adjusting the focus, opening/closing a shutter, triggering sensor readings, adjusting bias values, etc. Moreover, input signals may be used to alter the processing of the image data that occurs in the processor 222.

Processor 222 can further include other components to assist with the processing and control of the infrared imaging camera 100. For example, as discussed above, in some embodiments, an ADC can be incorporated into the processor 222. In such a case, analog signals conditioned by the front-end stages 204 are not digitized until reaching the processor 222. Moreover, some embodiments can include additional on board memory for storage of processing command information and scene data, prior to transmission to the display 108 or the output/control device 210.

An operator may interact with thermal imaging camera 100 via user interface 208, which may include buttons, keys, or another mechanism for receiving input from a user. The operator may receive output from thermal imaging camera 100 via display 108. Display 108 may be configured to display an infrared-image and/or a visible light image in any acceptable palette, or color scheme, and the palette may vary, e.g., in response to user control. In some examples, display 108 is configured to display an infrared image in a monochromatic palette such as grayscale or amber. In other examples, display 108 is configured to display an infrared image in a color palette such as, e.g., ironbow, blue-red, or other high contrast color scheme. Combinations of grayscale and color palette displays are also contemplated.

While processor 222 can control display 108 to concurrently display at least a portion of an infrared image and at least a portion of a visible light image in any suitable arrangement, a picture-in-picture arrangement may help an operator to easily focus and/or interpret a thermal image by displaying a corresponding visible image of the same scene in adjacent alignment.

A power supply (not shown) delivers operating power to the various components of thermal imaging camera 100 and, in some examples, may include a rechargeable or non-rechargeable battery and a power generation circuit.

During operation of thermal imaging camera 100, processor 222 controls infrared camera module 200 and visible light camera module 206 with the aid of instructions associated with program information that is stored in memory to generate a visible light image and an infrared image of a target scene. Processor 222 further controls display 108 to display the visible light image and/or the infrared image generated by thermal imaging camera 100.

Example thermal image cameras and related techniques have been described. The techniques described in this disclosure may also be embodied or encoded in a computer-readable medium, such as a non-transitory computer-readable storage medium containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), a hard disk, optical media, or other computer readable media.

Figure 4:
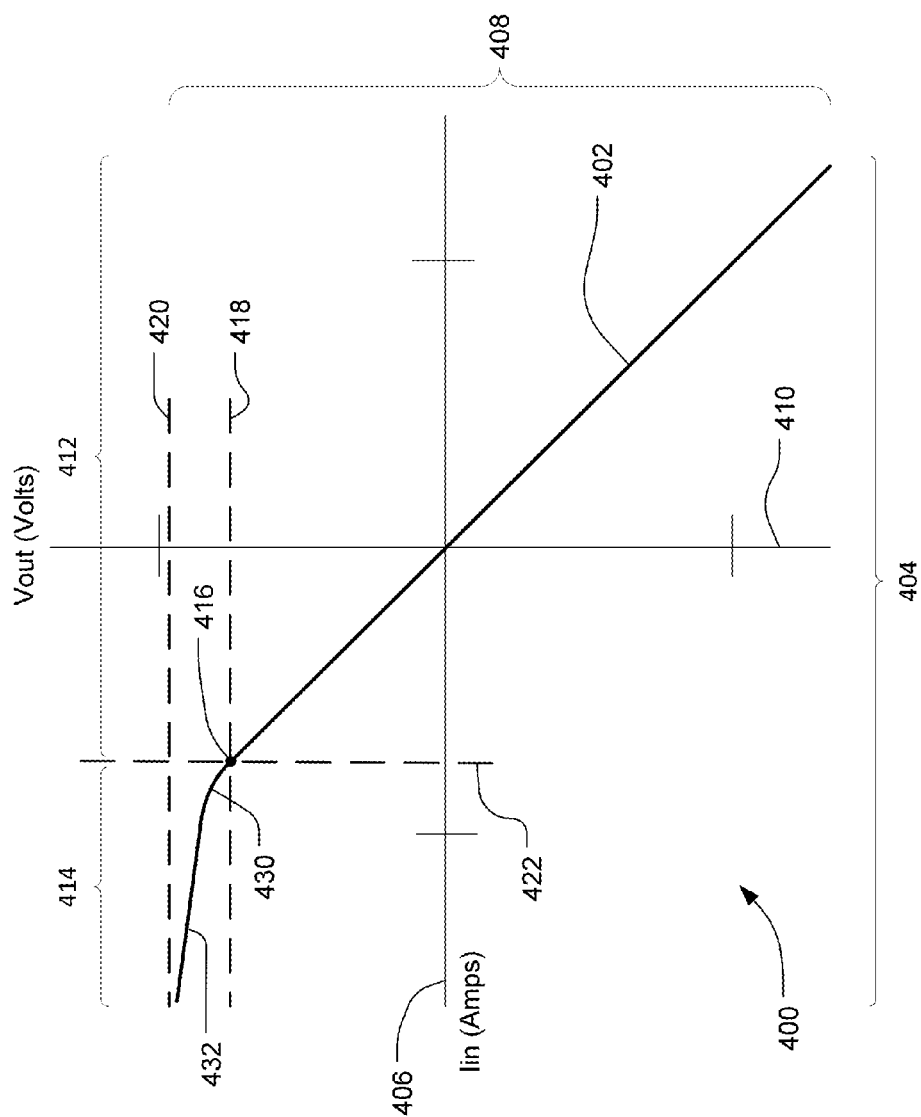
FIG. 4 is a graphic representation of an input-output transfer characteristic of an amplification stage according to an embodiment.

Turning to FIGS. 4-7, some embodiments illustrating techniques for amplifying the output of an IR sensor (e.g., such as IR sensor output signal 221 from IR camera module 200) will now be described. FIG. 4 is a graphic representation 400 of an input-output transfer characteristic 402 generated by an analog front end according to some embodiments. In general, the transfer characteristic 402 illustrates how a range of IR sensor output signals are conditioned by one or more portions of an analog front end to generate a corresponding range of amplified output signals. For example, referring briefly to FIG. 3, in some cases the transfer characteristic may represent a particular range of outputs generated based on the IR sensor output 221, using at least a portion of the analog front end 202, such as bias generator 224 and pre-amp/integrator 226.

Returning to FIG. 4, in this example the transfer characteristic 402 illustrates a gain function used in some embodiments to generate an amplifier output signal based on an IR sensor output signal. A range 404 of IR sensor output signals is illustrated along the horizontal axis 406 of the graph 400, in this case as a measure of output current from the IR sensor. A corresponding range 408 of amplifier output signals is illustrated along the vertical axis 410 of the graph 400, in this case as a measure of output voltage. Of course it should be appreciated that the IR sensor output and amplifier output signals can be measured and characterized in different manners (e.g., in terms of current, voltage, etc.). The gain function 402 thus represents a variable gain profile of an amplifier stage in which the gain used for signal amplification is a function of the amplifier input signal (i.e., the IR sensor output signal).

As shown in FIG. 4, in this case the amplifier stage of a thermal imaging apparatus is configured to provide the transfer characteristic or gain function 402 as a continuous gain function including at least two different gain regions. The term "continuous" is used to indicate that the gain function is generally configured to amplify an IR sensor output signal through a continuous range of possible sensor output signals (e.g., continuous range 404 of IR sensor output signal values) in order to generate an amplifier output signal with a corresponding continuous range of amplifier output values (e.g., continuous range 408 of amplifier output signal values).

Thus the continuous gain function 402 can be utilized to provide a continuous transfer characteristic for a particular set of input and output ranges without discontinuities or breaks in the gain curve 402. This example and other similar embodiments therefore have the advantage of having an amplifier stage that provides two or more different gain regions that are part of a single continuous gain curve, which avoids the need to switch operation between multiple amplifier ranges, for example by changing gain and bias settings. As mentioned above, switching between multiple amplifier ranges can lead to frequent shutter firings and noticeable pauses in operation, which some embodiments described herein can avoid by amplifying IR sensor output signals solely according to a single continuous gain function.

In the illustrated embodiment, the continuous gain function 402 includes a first gain region 412 that exhibits a first gain value and a second gain region 414 that has a second gain value. A transition point 416 marks a point on the gain curve 402 at the end of the first gain region 412 where the instantaneous amplifier input signal (the IR sensor output) corresponds to an amplifier output signal meeting a threshold value 418 at some point below a maximum amplifier output value 420. With respect to the polarity depicted in FIG. 4, for amplifier input signals with a value more negative than a corresponding threshold value 422, the gain function 402 is configured to continuously transition into the second gain region 414. More generally, in terms of signal magnitude, the gain function 402 continuously transitions into the second gain region 414 as the magnitude of the amplifier input signal begins to exceed the magnitude of threshold value 422.

As shown, in this example the first gain region 412 has a linear gain provided for higher values within the range of IR sensor output values and the second gain region 414 exhibits a nonlinear gain for lower values within the range of IR sensor outputs that increases at a slower rate for increasingly negative sensor output values. Configuring the continuous gain function 402 with different gains (e.g., such as the nonlinear second gain region 414 in this case) can thus allow the amplifier stage to amplify a greater range of IR sensor output signals without exceeding an amplifier output signal maximum. A greater range of possible IR sensor output signals is useful because this range corresponds to the dynamic range for the infrared sensor and associated imaging circuitry, meaning the dynamic range of possible temperatures that can be imaged from a particular scene.

Thus, by configuring the continuous gain function 402 with different gain regions having different gains, a thermal imager can provide a wider dynamic range using a single continuous gain function. In addition, the gains of the different regions can be adjusted or tailored to enhance signal-to-noise performance along different portions of the transfer characteristic. As shown in this example, the first linear gain region 412 provides a larger constant gain for smaller amplifier input magnitudes which can be susceptible to noise. On the other hand, the nonlinear second gain region 414 compresses the amplifier stage gain for larger amplifier input magnitudes (in this case with a negative polarity) which tend to be less susceptible to noise. Thus, use of the first and second gain regions 412, 414 allows processing of a wider range of inputs, with different amounts of gain to counteract varying amounts of noise, without the amplifier output exceeding or saturating a maximum amplifier output level. The term maximum amplifier output level is used herein to refer to a relevant maximum signal value, and is intended to include maximum values such as the actual amplifier maximum output value and a maximum input value for subsequent circuitry, such as an analog-to-digital converter.

According to some embodiments, different gain values and gain functions can be provided for different regions of the transfer characteristic depending upon the desired performance parameters of the amplifier stage. For example, as shown in FIG. 4, in this case the first gain region 412 has a larger gain in terms of absolute value and the second gain region 414 has a smaller gain in terms of absolute value relative to the other gain region. In addition, the first gain region 412 in this example is configured with a linear gain, while the second gain region 414 is configured with a nonlinear gain. Other combinations of two, three, or more gain regions, relative gain values, and/or different gain functions may also be employed depending upon the desired gain transfer characteristic. As one example, in some cases a continuous gain function may include a first gain region having a first linear gain and a second gain region having a second, smaller linear gain. As another example, in some cases a continuous gain function may include first, second, and third gain regions, one or more of which is configured with a nonlinear gain.

Referring again to FIG. 4, in some cases the different gain regions of the gain transfer function 402 can be described in different manners. For example, as previously described, the gain transfer function includes a first linear gain region 412 and a second nonlinear gain region 414. Alternatively, the second gain region 414 can be described as having a nonlinear region 430 and a linear region 432. Thus, the gain transfer function 402 can be considered to have a linear region (412) and a nonlinear region (414 or 430), two linear regions (412 and 432), and/or two linear regions (412, 342) and a nonlinear region (430). According to one example, the gain transfer function 402 can be described as having the first gain region 412 and the second gain region 432. The second gain region 432 generates amplifier output magnitudes less than the maximum amplifier output 420 and at least part of the first gain region 412 generates amplifier output magnitudes less than the magnitude of threshold 418, which is also less than the amplifier output magnitudes generated by the second gain region 432. In some cases the transfer function 402 is also described as having a third gain region 430 configured to generate amplifier output magnitudes less than the amplifier output magnitudes generated by the second gain region and more than the amplifier output magnitudes generated by the first gain region.

As described above, one possible advantage to using a continuous gain function, such as gain function 402, is that a wider range of possible IR sensor output signals and corresponding temperatures from a target scene can be processed with a single gain function. According to some embodiments, an amplifier stage may be configured with a gain function that provides a relatively large dynamic temperature range compared to temperature ranges currently available for a single gain setting. For example, in some cases a dynamic temperature range can include a temperature as low as about −30° C. (e.g., −30±1° C., ±10° C., etc.) and a temperature as high as about 300° C. (e.g., 300±1-10° C., ±30° C., etc.). In some cases a dynamic temperature range can include a temperature as low as about −30° C. and a temperature as high as about 600° C. (e.g., 600±1-10° C., ±60° C., etc.). Of course a number of different dynamic ranges are possible, including ranges below, above, and in between these examples.

As discussed above, portions of a thermal imager's analog front end can be configured to provide the continuous gain function according to some embodiments. Referring to FIG. 3, in some cases, for example, the bias generator 224 and the pre-amplifier and integrator 226 cooperate to provide the continuous gain function that is applied before sending the amplifier/integrator output to the ADC 230 and subsequently to the system processor 222. In some cases, the entire amplification operation may simply be described as occurring within the amplifier stage, which would include those portions of the analog front end 202 used to amplify the IR sensor output signals.

Figure 5:
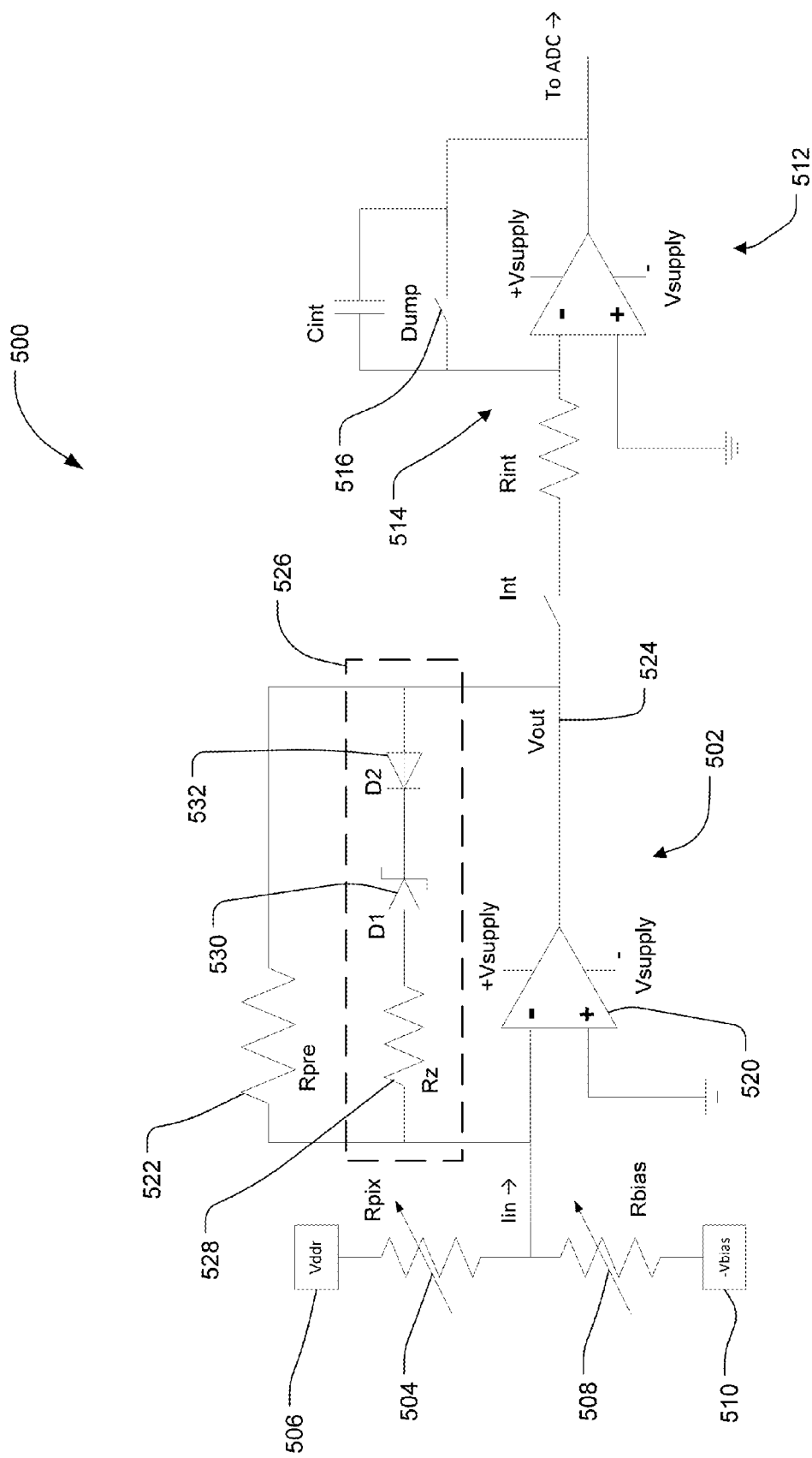
FIG. 5 is a schematic representation of a portion of a thermal imager analog front end including an amplifier stage according to an embodiment.

FIG. 5 is a schematic representation of a portion 500 of an analog front end including an amplifier stage 502 configured to provide a continuous gain function according to some embodiments. The amplifier stage 502 is electrically coupled to an IR sensor, which in FIG. 5 is represented by $R_{pix}$ 504. The IR sensor has a power supply $V_{ddr}$ 506 and is biased with a bias resistor $R_{bias}$ 508 and bias power source $V_{bias}$ 510. Although FIG. 5 simply illustrates a single resistor 504 as representing the IR sensor, it should be appreciated that this can represent an array of any number of IR sensor elements, and that other circuitry (not shown) selectively connects the amplifier stage 502 to each IR sensor element to receive and process an entire array of IR output signals as necessary. Connected to the output of the amplifier stage 502 is an integration stage 512 that integrates the amplified IR sensor output signal over time to generate a stable analog output signal that is then transmitted to the ADC for digitization and further processing. In this case the integration stage is provided by an integrating amplifier 514 with a dump switch 516 to clear the integration stage 512 between readings of different sensor elements.

In this example, the amplifier stage 502 is configured to provide a continuous gain function through the use of an amplifier 520 with a variable resistive feedback loop. As is shown, the amplifier 520 includes a parallel arrangement of two feedback paths. A first resistive feedback path is provided by $R_{pre}$ 522 which electrically couples the inverting input of the amplifier 520 to the amplifier output 524. A second feedback path is provided by means of saturation circuitry 526. The saturation circuitry 526 is generally configured to change states based on the amplifier output signal at 524, which thus changes the overall gain of the amplifier stage 502 when combined with the first feedback path provided by $R_{pre}$ 522. In this example, the saturation circuitry 526 is provided by a series connected resistor $R_z$ 528, zener diode 530, and second diode $D_2$ 532, which together are then coupled in parallel with $R_{pre}$ 522 between the inverting input of the amplifier 520 and the amplifier output 524.

According to some embodiments, the saturation circuitry 526 is generally configured to reduce the gain of the amplifier stage 502 at a certain threshold in order to provide an additional gain region with a different gain as described above with respect to FIG. 4. In this case, the saturation circuitry 526 is configured to provide the second gain region 414 of the continuous gain function 402. As will be appreciated, with proper supply and bias voltages applied to the IR sensor, operation of the amplifier stage 502 for a lower range of IR sensor output magnitudes (e.g., between threshold value 422 and the vertical axis in FIG. 4) will forward bias the zener diode 530 and reverse bias the second diode 532, thus cutting off current flow through the second feedback path and restricting feedback to the first feedback path provided by Rpre 522. This first mode of operation corresponds to the first linear gain range 412 illustrated in FIG. 4.

As the IR output signal magnitude increases (i.e., the value becomes more negative in this case) and the corresponding amplifier output signal magnitude increases, the zener diode 530 becomes increasingly reverse-biased, while the second diode D2 532 becomes forward-biased. The transition point 416 in FIG. 4 corresponds to a signal level at which the zener diode is sufficiently reversed-biased so as to enter into break-down operation. As the diode 530 begins to conduct current, the gain function enters into the second gain region 414. For example, the gain function will first exhibit the nonlinear gain region 430 as the zener diode 530 continues to conduct greater amounts of current. As the zener diode 530 completely enters breakdown, the gain function transitions to the effectively linear region 432, which corresponds to the resistive load provided by the parallel combination of $R_{pre}$ 522 and the resistance provided by $R_z$ 528, the zener diode 530, and the second diode 532.

A similar complementary operation occurs as signals level magnitudes decrease below the threshold point 416 and the circuit re-enters the first gain region 412. Accordingly, the use of the zener diode 530 and second diode 532 in the saturation circuitry 526 provides one manner in which a continuous gain function can be provided with at least two gain regions.

Figure 6:
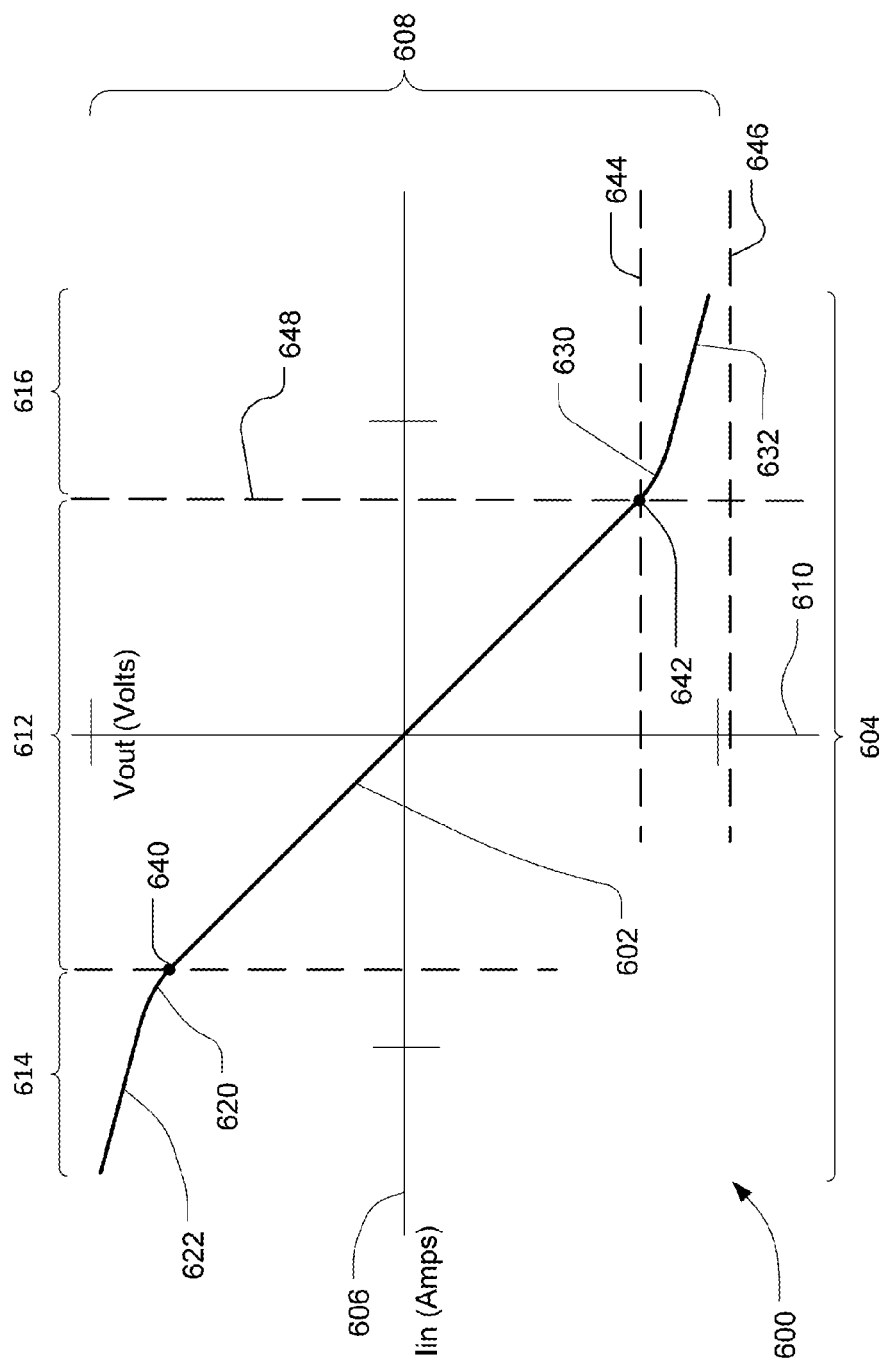
FIG. 6 is a graphic representation of an input-output transfer characteristic of an amplification stage according to an embodiment.

FIG. 6 is a graphic representation 600 of an input-output transfer characteristic 602 generated by an analog front end according to some embodiments. As will be appreciated, the transfer characteristic 602 has similarities to the gain function 402 depicted in FIG. 4, but in this case the transfer characteristic 602 provides a gain function that extends the dynamic range and improves the noise performance of a thermal imaging system by limiting bi-polar saturation. As shown in this example, a first linear gain region 612 provides a larger constant gain for smaller amplifier input magnitudes that can often be susceptible to noise. A nonlinear second gain region 614, and a nonlinear third gain region 616 compress the amplifier stage gain for larger amplifier input magnitudes, corresponding to higher and lower ranges of temperatures, respectively, which tend to be less susceptible to noise.

In this example a range 604 of IR sensor output signals is illustrated along the horizontal axis 606 of the graph 600, in this case as a measure of output current from the IR sensor corresponding to an amount of IR radiation being absorbed by the sensor. According to this example, increasingly negative sensor signal values along axis 606 correspond to increasingly greater amounts of IR radiation being absorbed by the IR sensor. Increasingly positive sensor signal values (moving rightward along axis 606 as shown in FIG. 6) correspond to increasingly lower amounts of IR radiation, corresponding to lower temperatures. Of course it should be appreciated that input and output signal polarities may be varied depending upon the type of read out, biasing, and amplification circuitry being employed.

The transfer characteristic or gain function 602 is in this case a continuous gain function including the three different gain regions 612, 614, and 616. Accordingly, the gain function 602 is generally configured to amplify an IR sensor output signal through the continuous range 604 of possible sensor output signals in order to generate an amplifier output signal with the corresponding continuous range 608 of amplifier output values. Thus, continuously transitioning between the first, second, and third gain regions 612, 614, and 616 allows processing of a wider range of inputs extending from low temperatures to high temperatures, without the amplifier output exceeding or saturating a maximum absolute amplifier output level, and without needing multiple amplifier stages and/or bias settings.

The different gain regions of the gain transfer function 602 can be described in different manners. For example, as previously described, the gain transfer function can be described as including a first linear gain region 612, a second nonlinear gain region 614, and a third nonlinear gain region 616. Alternatively, the second gain region 614 can be described as having a nonlinear region 620 and a linear region 622 and/or the third gain region 616 can be described as having a nonlinear region 630 and a linear region 632. Accordingly, the gain transfer function 602 can be described as having a variety of combinations of different gain regions.

The continuous gain function 602 includes a transition point 640 between the first gain region 612 and the second gain region 614, similar to the transition point 416 of the gain function 402 shown in FIG. 4. The gain function 602 in FIG. 6 also includes a second transition point 642 between the first gain region 612 and the third gain region 616. The second transition point 642 marks a point on the gain curve 602 at one end of the first gain region 612 where the instantaneous amplifier input signal (the IR sensor output) corresponds to an amplifier output signal magnitude meeting a threshold magnitude 644 at some point not exceeding a maximum amplifier output magnitude 646 (negative polarity in this case). For amplifier input signals with a magnitude exceeding the magnitude of a corresponding threshold value 648, the gain function 602 is configured to continuously transition into the third gain region 616.

Figure 7:
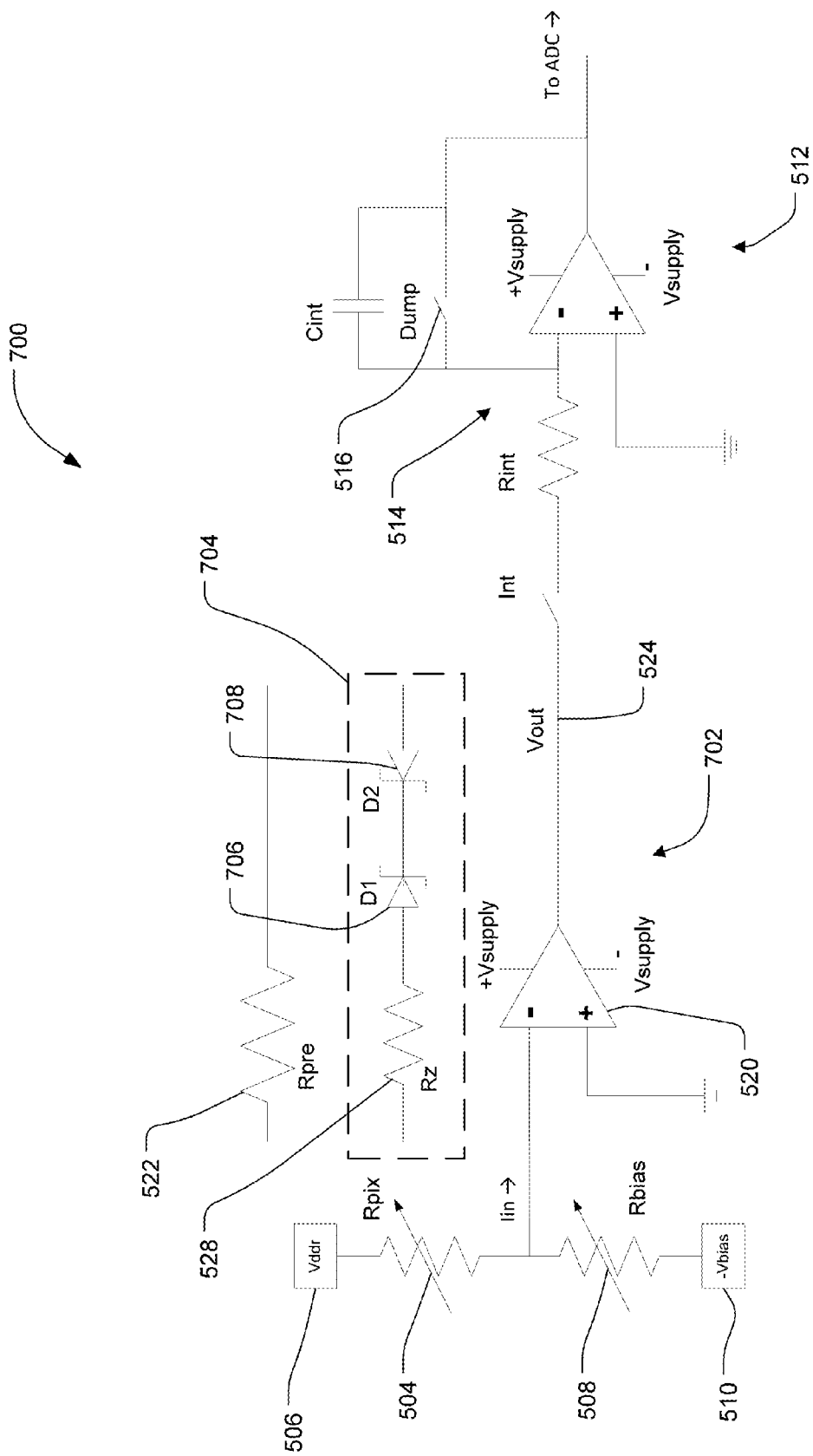
FIG. 7 is a schematic representation of a portion of a thermal imager analog front end including an amplifier stage according to an embodiment.

FIG. 7 is a schematic representation of a portion 700 of an analog front end including an amplifier stage 702 configured to provide the continuous gain function 602 illustrated in FIG. 6 according to some embodiments. As shown, the portion 700 of the front end is similar to the portion 500 illustrated in FIG. 5, and for simplicity similar elements are not further described with respect to FIG. 7. In this example, the amplifier stage 702 includes saturation circuitry 704 that is generally configured to change states based on the amplifier output signal at 524, which thus changes the overall gain of the amplifier stage 702 when combined with the first feedback path provided by $R_{pre}$ 522. In this example, the saturation circuitry 704 is provided by a series connected resistor $R_z$ 528, a first zener diode 706, and a second zener diode 708, which together form a second feedback path that is coupled in parallel with $R_{pre}$ 522 between the inverting input of the amplifier 520 and the amplifier output 524.

The saturation circuitry 704 is generally configured to reduce the absolute gain of the amplifier stage 702 at certain threshold values in order to provide the additional gain regions described above with respect to FIG. 6. In this case, the first zener diode 706 of the saturation circuitry 704 is configured to provide the second gain region 614 in a manner similar to that described above with respect to FIGS. 4 and 5. As provided in this example, the second zener diode 708 of the saturation circuitry 704 is configured to provide the third gain region 616 in a similar but complimentary manner. For example, moving rightward along the graph in FIG. 6, as the IR output signal value and the corresponding amplifier output signal value become more negative (and thus increase in magnitude), the second zener diode 708 becomes increasingly reverse-biased, while the first zener diode 706 becomes forward-biased. As the diode 708 begins to conduct current, the gain function enters into the third gain region 616. For example, the gain function will first exhibit the nonlinear gain region 630, as the zener diode 708 continues to conduct greater amounts of current. After the zener diode 708 completely enters breakdown, the gain function transitions to the effectively linear region 632, which corresponds to the resistive load provided by the parallel combination of $R_{pre}$ 522 and the resistance provided by $R_z$ 528, the first zener diode 706, and the second zener diode 708.

As discussed above, embodiments disclosed herein may be useful for amplifying the output of one or more IR sensors included in many types of thermal imaging apparatuses, systems, and/or methods. As one example, a thermal imaging embodiment may record and/or display relative differences in temperature between multiple locations in a target scene without exact information about specific absolute temperatures. In some cases, an embodiment may also measure actual temperatures within a target scene at least based on the amount of radiation absorbed by infrared sensors directed at the target scene. As is known, a number of factors can affect the accuracy of radiometric temperature measurements, and thus processes have been developed to calibrate infrared sensors, thermal imagers, systems, and the like to provide more accurate temperature measurements.

According to some embodiments, a thermal imaging system with an amplifier stage configured to provide a continuous gain function such as one of the functions described herein may be calibrated such that at least one of two or more gain regions are calibrated for measuring actual temperatures of a target scene. For example, in some cases, one, two, or more linear gain regions may be calibrated for radiometric temperature measurement. It is also contemplated that one or more nonlinear gain regions may be calibrated for temperature along with or instead of one or more linear gain regions.

Calibration procedures may be employed at various times according to some embodiments. One calibration time is while the thermal imager is being manufactured. In this case, the imager can be subjected to various ambient temperatures as well as exposed to calibrated blackbody or other target emissions as described above in what may be called the "factory calibration." Data taken during "factory calibration" is typically extensive, and can be used to correlate FPA heat-sunk pixel readings to biasing points. Factory calibration may be utilized to substantially establish bias for the electronics at desired target bias levels.

In many embodiments, a thermal imaging system can be initially calibrated during manufacture by sensing the radiation emitted by a thermal target that is heated to a precisely known temperature. Such techniques may be useful for initially calibrating linear gain regions of a thermal imager, for example. In some cases such an thermal imaging/thermometer calibration system includes a target in thermal contact with a temperature sensor. The target has a radiating face bearing a high-emissivity coating such as a high-emissivity paint, which may have a temperature dependent emissivity, though the emissivity of the coating may vary less with temperature than most substances. A heating element is also positioned in thermal contact with the target, and coupled, along with the temperature sensor, to a controller that reads an output from the sensor and controls power to the heating element according to the reading and a set temperature specified by a user or program executed by the controller. The radiant energy emitted from the target at several points on the radiating face can then be measured by the IR sensors of the thermal imager's FPA, mapped to the set temperature of the target, and stored within calibration data in the thermal imager for future use. A further discussion of IR thermal calibration systems is provided in U.S. Pat. No. 7,661,876, issued Feb. 16, 2010, entitled "Infrared target temperature correction system and method," the entire content of which is hereby incorporated herein by reference.

Another example of thermal calibration (e.g., also useful for calibrating linear gain regions) can correct for differences in detector response that occur even under conditions where uniform electrical bias and incident infrared radiation are applied to an array of microbolometer detectors. This type of response variation is commonly referred to as spatial nonuniformity, and is due to the variations in a number of critical performance characteristics of the microbolometer detectors. This is a natural result of the microbolometer fabrication process. The characteristics contributing to spatial non-uniformity include the infrared radiation absorption coefficient, resistance, temperature coefficient of resistance (TCR), heat capacity, and thermal conductivity of the individual detectors. In order to achieve an output signal that more accurately reflects the level of incident infrared radiation, processing to correct for detector non-uniformity is required. One method of calibrating for non-uniformity is through the use of a two-point correction technique including offset and gain corrections determined and normally stored in a correction coefficient memory. Additional methods for calibrating for spatial non-uniformity are described in U.S. Pat. No. 5,756,999, entitled "Methods and Circuitry for Correcting Temperature-Induced Errors in Microbolometer Focal Plane Array," issued May 26, 1998, the entire content of which is hereby incorporated herein by reference in its entirety.

Another time for "calibration" is during normal operation, when the imager may use a shutter as a uniform target for purposes of further "calibration." Calibrations in the field, using a shutter or similar target, may then be employed to further refine the "factory calibration." In some cases cooling and/or temperature stabilization mechanisms may be used to reduce the effect of in-use temperature variations within an FPA, thus also reducing the need for further calibration to correct errors causes by such temperature variations. Other techniques can also be used to calibrate a thermal imaging system in the field (e.g., by calibrating one or more linear gain regions) to account for such temperature variations without such cooling/stabilization mechanisms. U.S. Pat. No. 7,304,297, issued Dec. 4, 2007, and entitled "Thermal Imager Utilizing Improved Radiometric Calibration Technique" describes some possible techniques that use a shutter mechanism to calibrate the thermal imager. In these examples, a shutter mechanism includes a flag that is periodically moved in front of the FPA in order to generate a reference signal correlated with ambient temperature information, which can then be used along with other data to provide more accurate temperature information about a target scene out away from the imager. U.S. Pat. No. 7,304,297 is hereby incorporated by reference herein in its entirety.

In a more general sense, a thermal imaging system/camera/method/etc. can be radiometrically calibrated using a relationship or function that relates the power incident to the IR sensors on the imager's FPA (and thus the corresponding temperature of the target) to a number of measurable characteristics of the FPA, including the current IR detector pixel value (e.g., IR detector resistance). According to some embodiments, one or more linear and/or nonlinear ranges of a thermal imaging system may be radiometrically calibrated for temperature according to the following relationship:

$$\vec{P} = (\vec{R} - \overline{hs})\vec{F}_1(T_{fpa}, \overline{hs}) + (\vec{R} - \overline{hs})^2 \vec{F}_2(T_{fpa}, \overline{hs}) + \vec{A}_0 + \vec{A}_1(T_{fpa}) + \vec{A}_2(T_{fpa}^2) + \vec{A}_{Lens}(T_{Lens})$$

in which
P=Radiant power incident to the sensor;
$T_{fpa}$=Temperature of the FPA;
hs=Value of a currently selected heat sunk pixel;
$F_{1,2}$=Parameters describing the gain of the FPA (as a function of the FPA temperature and current heat sunk pixel value);
R=Value of the currently selected IR detector pixel;
$A_{0,1,2}$=An offset parameter associated with the FPA; and
$A_{Lens}$=An offset parameter associated with the imager lens assembly.

To calibrate the thermal imager, the imager could be pointed at one or more reference targets or sources, and then data could be collected to solve for the various factors of the relationship.

As previously mentioned, some embodiments provide methods for amplifying IR sensor outputs while also improving noise and/or dynamic range performance. According to one embodiment, one such method includes receiving a sensor output signal and amplifying the sensor output signal with a gain to generate an amplifier output signal. The gain is provided according to a continuous gain function with two or more different gain regions as discussed in examples above. In some cases, amplifying the sensor output signal includes amplifying the signal according to a first gain region of the continuous gain function if the sensor output signal is within a first range of sensor output signals and amplifying according to a second gain region of the continuous gain function if the sensor output signal is within a second range of sensor output signals. The second range of sensor output signals is based on the amplifier output signal meeting a threshold value below a maximum amplifier output. The method can also include generating a thermal image of the target scene based on the amplifier output signal. In some embodiments such a method may further include using the continuous gain function to map a dynamic temperature range for the target scene to the amplifier output range.

Thus, various embodiments have been disclosed. Although the present invention has been described in detail with reference to certain disclosed embodiments, the disclosed embodiments are presented for purposes of illustration and other embodiments are also possible. One skilled in the art will appreciate that various changes, adaptations, and modifications may be made without departing from the spirit of this disclosure, and will appreciate that the disclosed examples and other embodiments are within the scope of the appended claims.

What is claimed is:

1. A thermal imaging camera, comprising:
an infrared (IR) camera module comprising an IR sensor for detecting IR radiation from a target scene, the IR sensor comprising a plurality of IR sensor elements arranged to receive the IR radiation from the target scene, each IR sensor element corresponding to part of a thermal image of the target scene and configured to produce an IR sensor element output signal based on an electrical characteristic that varies corresponding to an amount of the IR radiation received by the IR sensor element;
an amplifier stage coupled to the IR sensor for receiving the IR sensor element output signals from each of the plurality of IR sensor elements,
the amplifier stage comprising a gain provided according to a continuous gain function configured to amplify the IR sensor element output signals from each of the plurality of IR sensor elements through a continuous range of IR sensor element output values to generate amplifier output signals corresponding to each of the plurality of IR sensor elements, the amplifier output signals having a corresponding continuous range of amplifier output values, the continuous gain function comprising a first gain region having a first gain and a second gain region having a second gain different than the first gain,
wherein the first gain region is applied to a first range of IR sensor element output values and generates a corresponding first range of amplifier output values and the second gain region is applied to a second range of IR sensor element output values and generates a corresponding second range of amplifier output values; and
processing circuitry coupled to the amplifier stage, the processing circuitry configured to generate the thermal image of the target scene based on the amplifier output signals.

2. The thermal imaging camera of claim 1, wherein the amplifier stage further comprises an amplifier output range extending to a maximum amplifier output, wherein at least part of the second gain region generates amplifier output magnitudes less than the maximum amplifier output, wherein the first gain region generates amplifier output magnitudes less than the amplifier output magnitudes generated by the second gain region, and wherein the second gain region comprises a smaller gain than the first gain region.

3. The thermal imaging camera of claim 2, wherein the first gain region comprises a linear gain and the second gain region comprises a nonlinear gain.

4. The thermal imaging camera of claim 2, wherein the first gain region comprises a first linear gain and the second gain region comprises a second linear gain.

5. The thermal imaging camera of claim 4, wherein the continuous gain function further comprises a third gain region having a nonlinear gain and configured to generate amplifier output magnitudes less than the amplifier output magnitudes generated by the second gain region and more than the amplifier output magnitudes generated by the first gain region.

6. The thermal imaging camera of claim 2, wherein the amplifier stage further comprises saturation circuitry configured to reduce the gain of the amplifier stage to provide the second gain region.

7. The thermal imaging camera of claim 2, wherein the continuous range of IR sensor element output values comprises a dynamic sensor output range corresponding to a dynamic temperature range for the target scene, wherein the continuous gain function maps the dynamic sensor output range to the amplifier output range to enable imaging of the dynamic temperature range for the target scene.

8. The thermal imaging camera of claim 7, wherein the dynamic temperature range for the target scene comprises a temperature of about −30° C. and a temperature of about 300° C.

9. The thermal imaging camera of claim 7, wherein the dynamic temperature range for the target scene comprises a temperature of about −30° C. and a temperature of about 600° C.

10. The thermal imaging camera of claim 1, wherein the amplifier stage is configured to amplify each IR sensor element output signal solely according to the continuous gain function.

11. The thermal imaging camera of claim 1, wherein at least one of the first gain region and the second gain region are calibrated for measuring temperatures of the target scene.

12. A thermal imaging apparatus, comprising:
an infrared (IR) camera module comprising an IR sensor for detecting IR radiation from a target scene, the IR sensor comprising a plurality of IR sensor elements arranged to receive the IR radiation from the target scene, each IR sensor element corresponding to part of a thermal image of the target scene and configured to produce an IR sensor element output signal based on an electrical characteristic that varies corresponding to an amount of the IR radiation received by the IR sensor element;
an amplifier stage coupled to the IR sensor for receiving the IR sensor element output signals from each of the plurality of IR sensor elements, the amplifier stage comprising a gain for amplifying the IR sensor element output signal from each of the plurality of IR sensor elements to generate amplifier output signals corresponding to each of the plurality of IR sensor elements, the gain provided according to a continuous gain function having a first gain region and a second gain region and configured to amplify the each of the IR sensor element output signals through a continuous range of IR sensor element output values to generate the corresponding amplifier output signals with a corresponding continuous range of amplifier output values, and
saturation circuitry configured to, for each of the IR sensor element output signals, reduce the gain of the amplifier stage according to the continuous gain function in the event that the corresponding amplifier output signal meets a threshold value below a maximum amplifier output such that, for each of the IR sensor elements, if the first gain region applied to the IR sensor element output signal results in the corresponding amplifier output signal meeting the threshold value, the saturation circuitry reduces the gain applied to that IR sensor element output signal so that the second gain region is applied to the IR sensor element output signal; and processing circuitry coupled to the amplifier stage and configured to generate the thermal image of the target scene based on each of the amplifier output signals corresponding to the respective IR sensor element output signals from each of the plurality of IR sensor elements.

13. The thermal imaging apparatus of claim 12, wherein the amplifier stage comprises an amplifier output range extending to the maximum amplifier output, wherein the first gain region includes a linear first gain and the second gain region includes a second gain smaller than the first gain.

14. The thermal imaging apparatus of claim 13, wherein the second gain comprises a nonlinear gain.

15. The thermal imaging apparatus of claim 13, wherein the continuous gain function further comprises a third gain region having a nonlinear gain and configured to generate amplifier output magnitudes less than amplifier output magnitudes generated by the second gain region and more than amplifier output magnitudes generated by the first gain region.

16. The thermal imaging apparatus of claim 13, wherein at least one of the first gain region and the second gain region are calibrated for measuring temperatures of the target scene.

17. The thermal imaging apparatus of claim 12, wherein the saturation circuitry comprises an amplifier feedback element configured to change states in the event that one of the amplifier output signals meets the threshold value.

18. The thermal imaging apparatus of claim 17, wherein the amplifier stage comprises an amplifier with a resistive feedback loop, wherein the saturation circuitry comprises a zener diode in parallel with the resistive feedback loop, and wherein the threshold value comprises a breakdown voltage of the zener diode.

19. A method, comprising:
receiving a plurality of IR sensor element output signals corresponding to an amount of infrared radiation received by each of a plurality of IR sensor elements from a target scene, each of the IR sensor elements corresponding to a part of a thermal image of the target scene; amplifying each of the IR sensor element output signals with a gain of an amplifier stage to generate a plurality of amplifier output signals, each of the plurality of amplifier output signals corresponding to one of the plurality of IR sensor elements, the gain provided according to a continuous gain function configured to amplify each of the IR sensor element output signals through a continuous range of IR sensor element output values to generate the corresponding amplifier output signal with a corresponding continuous range of amplifier output values, wherein for each of the IR sensor element output signals, the amplifying of the IR sensor element output signal comprises:

if the IR sensor element output signal is within a first range of IR sensor element output signals, applying a first gain region of the continuous gain function to the IR sensor element output signal to generate an amplifier output value within a corresponding first range of amplifier output values, and if the IR sensor element output signal is within a second range of IR sensor element output signals, applying a second gain region of the continuous gain function to the IR sensor element output signal to generate an amplifier output value within a corresponding second range of amplifier output values, wherein the second range of IR sensor element output signals comprises IR sensor element output signals such that applying the first gain region to such IR sensor element output signals generates amplifier output values that exceed a threshold value, the threshold value being below a maximum amplifier output value; and generating a thermal image of the target scene based at least on the plurality of amplifier output signals.

20. The method of claim 19, wherein the amplifier stage comprises an amplifier output range extending to the maximum amplifier output, wherein at least part of the second gain region comprises a smaller gain than the first gain region and generates amplifier output magnitudes less than the maximum amplifier output, wherein the first gain region comprises a linear gain and generates amplifier output magnitudes less than the amplifier output magnitudes generated by the second gain region.

21. The method of claim 20, wherein the second gain region comprises a nonlinear gain.

22. The method of claim 20, wherein the continuous gain function further comprises a third gain region having a nonlinear gain and configured to generate amplifier output magnitudes less than the amplifier output magnitudes generated by the second gain region and more than the amplifier output magnitudes generated by the first gain region.

23. The method of claim 20, further comprising using the continuous gain function to map a dynamic temperature range for the target scene to the amplifier output range.

24. The method of claim 23, wherein the dynamic temperature range comprises a range of about 300° C.

25. The method of claim 23, wherein the dynamic temperature range comprises a range of about 600° C.

26. The method of claim 19, wherein at least one of the first gain region and the second gain region are calibrated for measuring temperatures of the target scene.

* * * * *